(12) United States Patent
Lamborghini et al.

(10) Patent No.: US 12,394,871 B2
(45) Date of Patent: Aug. 19, 2025

(54) CLAD BATTERY CONNECTOR SYSTEM

(71) Applicant: EMS Engineered Materials Solutions, LLC, Attleboro, MA (US)

(72) Inventors: Louis R. Lamborghini, Smithfield, RI (US); Michael Haynes, Attleboro, MA (US)

(73) Assignee: EMS Engineered Materials Solutions, LLC, Attleboro, MA (US)

( * ) Notice: Subject to any disclaimer, the term of this patent is extended or adjusted under 35 U.S.C. 154(b) by 604 days.

(21) Appl. No.: 17/508,237

(22) Filed: Oct. 22, 2021

(65) Prior Publication Data
US 2022/0158313 A1    May 19, 2022

Related U.S. Application Data

(60) Provisional application No. 63/104,058, filed on Oct. 22, 2020.

(51) Int. Cl.
| | |
|---|---|
| H01M 50/569 | (2021.01) |
| H01M 10/42 | (2006.01) |
| H01R 4/02 | (2006.01) |
| H01R 4/18 | (2006.01) |
| H01R 12/53 | (2011.01) |
| H02J 7/00 | (2006.01) |

(52) U.S. Cl.
CPC ....... *H01M 50/569* (2021.01); *H01M 10/425* (2013.01); *H02J 7/0013* (2013.01); *H02J 7/0048* (2020.01); *H02J 7/005* (2020.01); *H01M 2010/4271* (2013.01); *H01R 4/029* (2013.01); *H01R 4/183* (2013.01); *H01R 12/53* (2013.01)

(58) Field of Classification Search
None
See application file for complete search history.

(56) References Cited

U.S. PATENT DOCUMENTS

| | | |
|---|---|---|
| 9,147,875 B1 | 9/2015 | Coakley et al. |
| 2010/0116570 A1 | 5/2010 | Sugawara et al. |
| 2012/0244397 A1* | 9/2012 | TenHouten ......... H01M 10/625 429/61 |

(Continued)

FOREIGN PATENT DOCUMENTS

WO    WO9831059    7/1998

OTHER PUBLICATIONS

International Search Report and Written Opinion released by the U.S. Receiving Office on Jan. 21, 2022 for corresponding application PCT/US2021/056173; 9 pages.

(Continued)

*Primary Examiner* — Carlos Barcena
(74) *Attorney, Agent, or Firm* — Smith Gambrell & Russell LLP

(57) ABSTRACT

A battery cell connector for use with an external device. In an aspect, the battery cell connector comprises a body with at least three layers, configured to simultaneously provide improved weldability and conductivity. In the same aspect, the battery cell connector comprises a terminal connected to the terminal arm of the body of the cell connector and a voltage transmitting component connected to said terminal, wherein the voltage transmitting component is configured to connect to an external device on the opposing end.

11 Claims, 5 Drawing Sheets

(56) References Cited

U.S. PATENT DOCUMENTS

2014/0134464 A1* 5/2014 Jang .................... H01M 50/569
                                                    429/61
2015/0357621 A1* 12/2015 Hardy ................... B32B 15/015
                                                    428/685
2015/0372354 A1   12/2015 Nakano et al.
2016/0172642 A1    6/2016 Hughes et al.
2017/0298493 A1* 10/2017 Mennucci .............. B23K 20/02

OTHER PUBLICATIONS

Holderby, T., "Why Use Tinned Copper Wire?", Service Wire Company, downloaded from the internet: https://webarchive.org/web/20210206113730/https://www.servicewire.com; Jun. 2019; 5 pages.

* cited by examiner

Middle Cell Connectors directly soldered to BMS

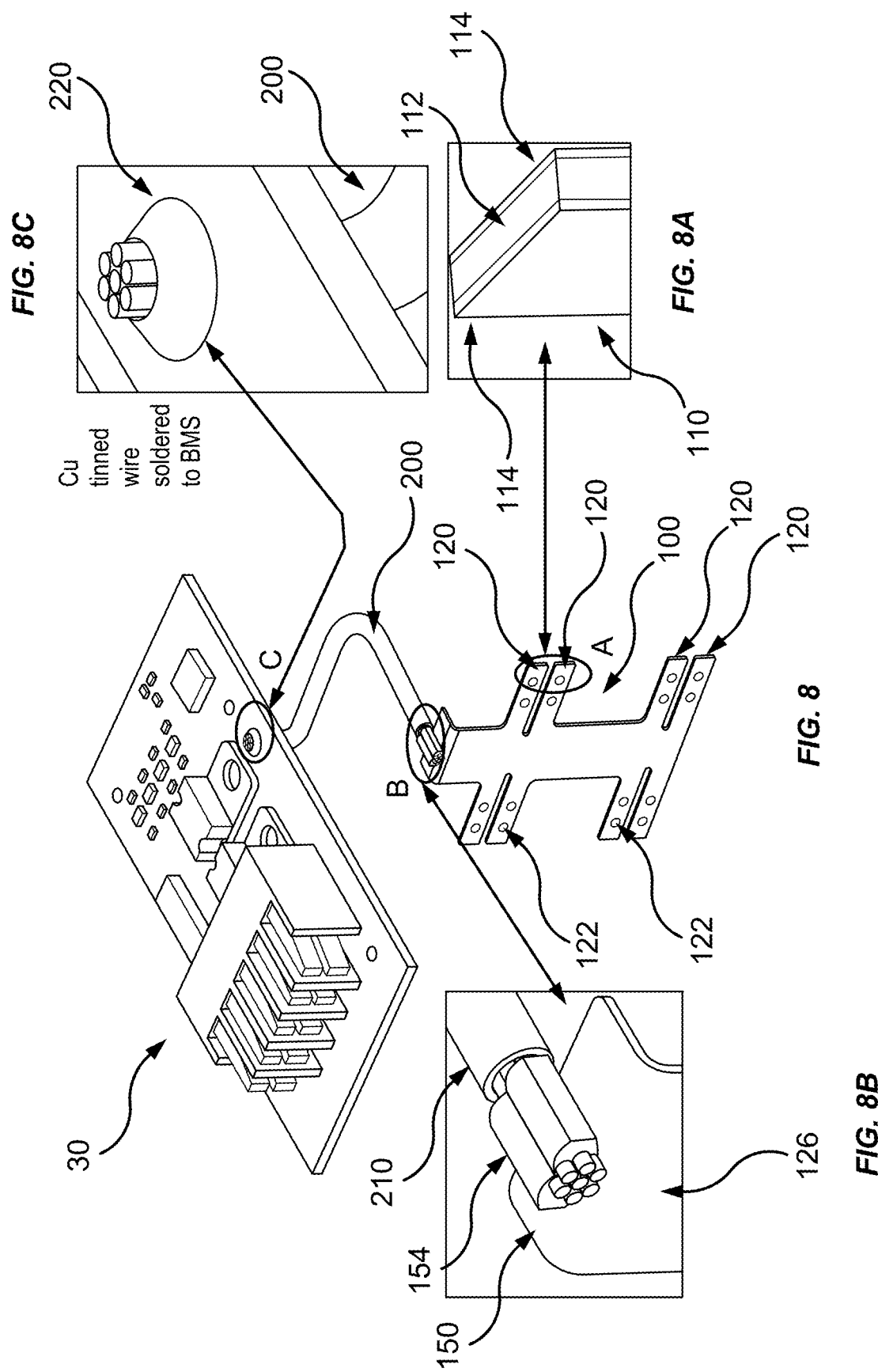

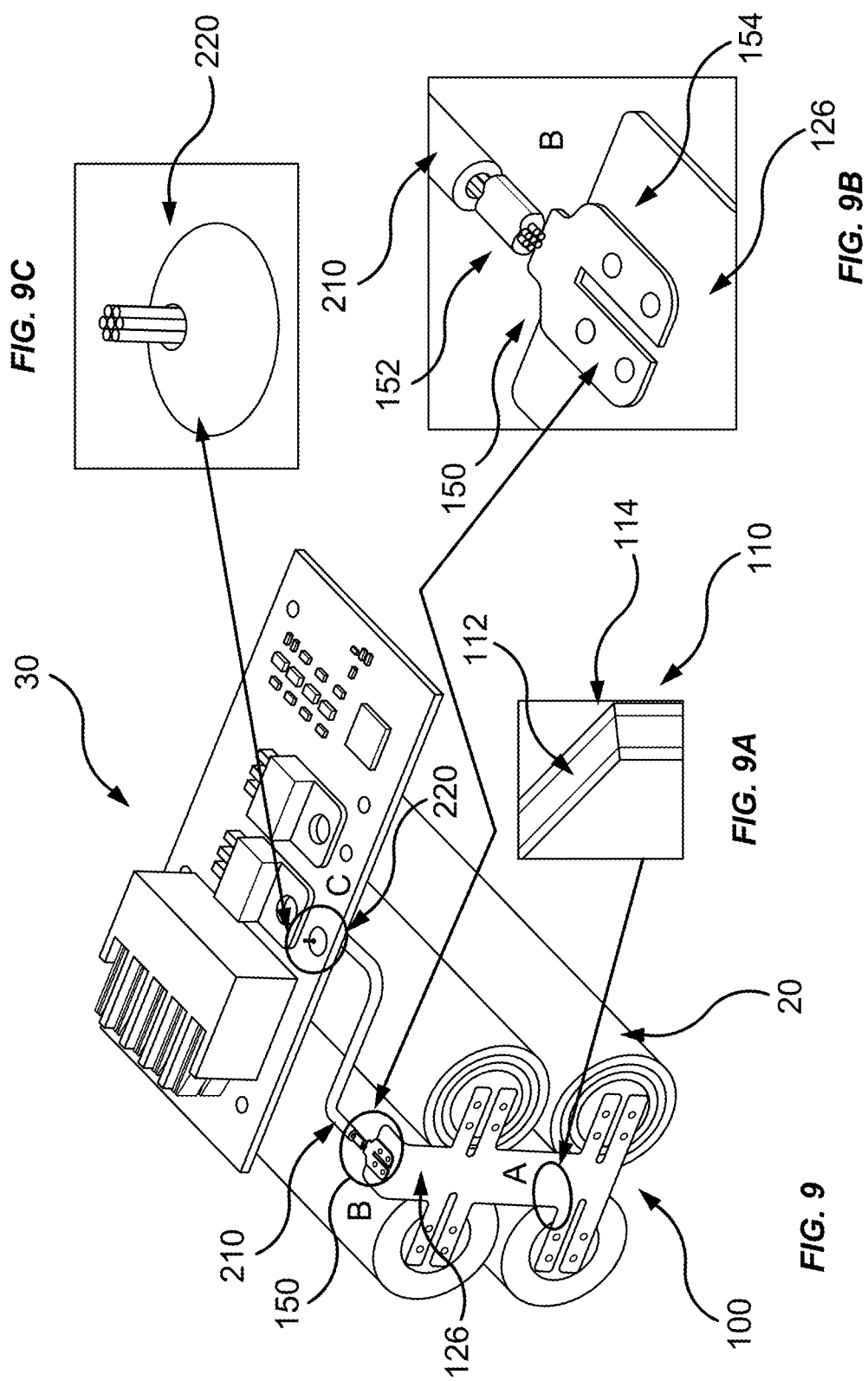

CLAD BATTERY CONNECTOR SYSTEM

TECHNICAL FIELD

This disclosure relates to battery connector systems.

BACKGROUND

As battery cells improve, there is a need to have better battery connecting systems, especially for connections between the batteries and a battery management system (BMS). Currently, the use of lithium ion (Li-ion) batteries in such battery cells has increased dramatically. Such battery cells need to be able to be connected in series and parallel arrangements to create battery packs and connect to the BMS, which monitors and protects for overcharge and undercharge of individual battery cells (as well as other battery pack related functions). Traditional nickel strip and copper alloys have been used to form these connectors (See FIGS. 1 and 2). However, utilizing only copper or nickel strips has drawbacks. For example, copper has higher electrical and thermal conductivity properties, but is hard to weld and solder. Conversely, nickel strips have better weldability and solderability to battery management systems (BMS), but lower electrical and thermal conductivity. Further, many mono metal battery connectors require a lot of material to be used to connect the battery cells to the BMS. Such a design can be more expensive, and less effective.

To overcome these limitations, cladded materials have been produced for connectors. While such a system has its advantages, there are some drawbacks. For example, the more metal layers in a cladded material, the costlier the cladded material. Further, when the cladded material is processed (e.g., stamping out parts out of flat stock), the scrap reclaim value is less than that of mono metal, requiring the need for more efficient cell connector geometries when using cladded material. In some instances, these connectors are configured to connect directly to the battery cells and BMS, requiring more material. Further, in some instances, the cladded material is plated to facilitate solderability to a BMS. Another challenge for cell connectors is that they are designed with large scrap yields. This is okay for systems that are mono metal due to high scrap reclaim. However, clad systems are very sensitive to large scrap yields compared to mono metal systems because the reclaim value (i.e., the ability to reuse the material) is much lower.

Therefore, there is a need for a system that addresses the shortcomings discussed above.

SUMMARY

It is to be understood that this summary is not an extensive overview of the disclosure. This summary is exemplary and not restrictive and it is intended to neither identify key or critical elements of the disclosure nor delineate the scope thereof. The sole purpose of this summary is to explain and exemplify certain concepts of the disclosure as an introduction to the following complete and extensive detailed description.

The present disclosure relates to a system, apparatus, and method for a cladded battery cell connector with a connecting wire configured to transmit voltage readings to a battery management system (BMS) by being connected at one end to the body of a battery connector via a terminal that can be welded to the battery connector body and at the other end to a BMS. In an aspect, the cladded battery connector can be configured to include three cladded layers of metal that do not require plating. In such aspects, the cladded battery connector can include a stainless steel/copper/stainless configuration. In some of these aspects, the cladded battery connector can include a 304SS/Cu/304SS configuration. In an aspect, the cladded battery connector including a 304SS/Cu/304SS configuration provides enhanced weldability and conductivity properties essential for voltage management devices. In an aspect, the battery connector body can be welded to the terminals of the plurality of batteries. In an aspect, the connecting wire connects the cladded battery connector to the BMS. In an aspect, the connecting wire can include a tinned copper wire. In an aspect, the wire can be crimped into a terminal at one end to be welded to the cladded battery connector. In an aspect, the connecting wire can include a BMS connector end configured to be soldered directly to a BMS for cell voltage management. In an aspect, the use of a three-layered cladded battery connector body combined with a voltage transmitting wire attached via crimp terminal reduces manufacturing costs and material waste.

BRIEF DESCRIPTION OF THE DRAWINGS

The features and components of the following figures are illustrated to emphasize the general principles of the present disclosure. Corresponding features and components throughout the figures can be designated by matching reference characters for the sake of consistency and clarity.

FIGS. 8 and 8A-C illustrate the integration of the battery connector system of FIG. 6 in connection with a Battery Management System (BMS).

FIGS. 9 and 9A-C illustrate a battery connector system integrated with a BMS and batteries according to an aspect of the present invention.

DETAILED DESCRIPTION

I. Definitions

Figure 1:
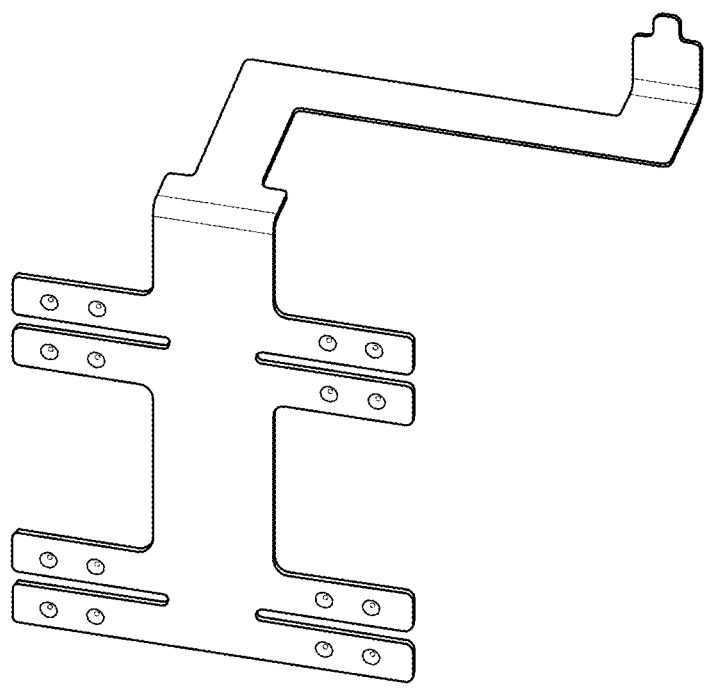
FIG. 1 illustrates a typical battery connector system known in the art.
Figure 2:
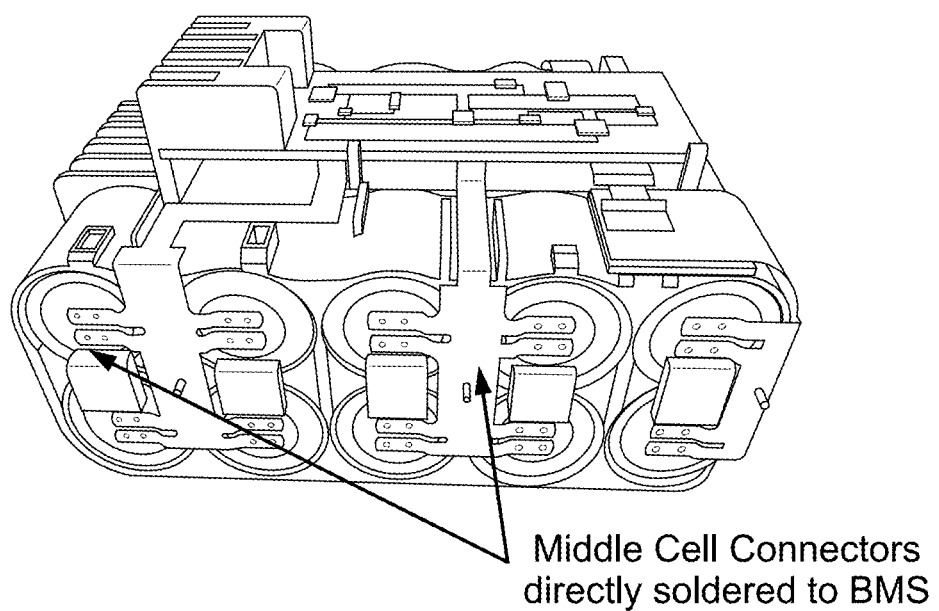
FIG. 2 illustrates the battery connector system of FIG. 1.
Figure 3:
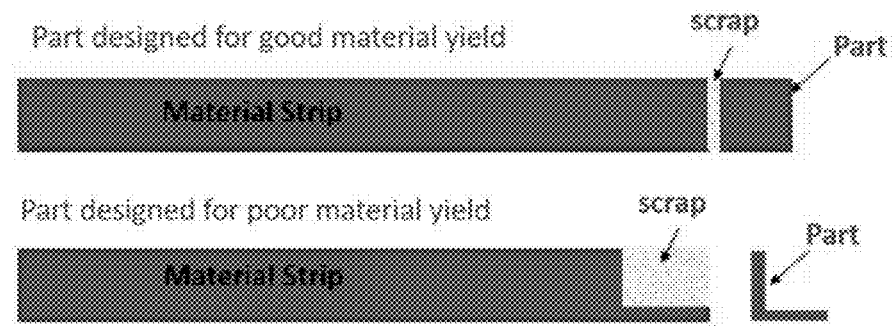
FIG. 3 illustrates a comparison of a part designed for good material yield and a part designed for poor material yield.
Figure 4:
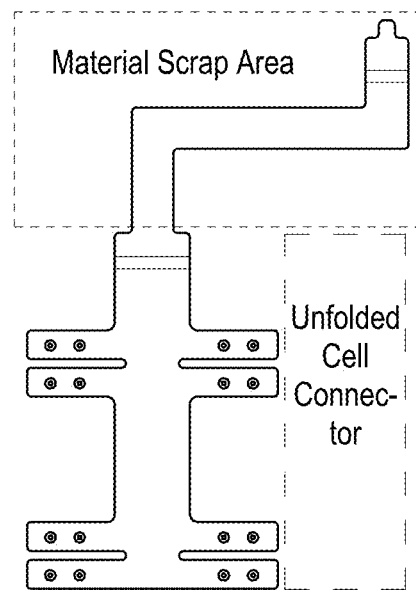
FIG. 4 illustrates a high scrap yield design for connectors known in the art.

As used herein, range values may vary ±10% depending on properties such as finishing thickness or manufacturing conditions.

As used herein, "American Wire Gauge (AWG)" describes the diameter of wires used in the current invention. This metric involves a logarithmic stepped standardized wire gauge.

As used herein, "International Annealed Copper Standard (IACS)" represents the percentage at which a material can conduct electrical current relative to that of copper, a known conductor with an IACS value of 100%.

As used herein, "crimped" refers to an item that has undergone a compression resulting in a fold. In the context of the current invention, a wire may be crimped into a terminal such that the terminal and wire are sufficiently connected.

As used herein, "weldable" refers to how easily welded a material is. In order to be considered easily welded, a material must be compatible with a variety of welding techniques (e.g. TIG, MIG, Stick, etc.) and not require undue surface preparation to ensure a quality weld. Other aspects contributing to a material being weldable include low thermal and electrical conductivity, which allow heat to not be easily conducted away from the welding joint.

As used herein, "tinned" refers to a material that has been coated in a layer of tin such that the material can easily be soldered to another surface. The material which has been tinned typically is not easily soldered, which presents the need for this process.

II. Battery Cell Connector System

The present disclosure can be understood more readily by reference to the following detailed description, examples, drawings, and claims, and their previous and following description. However, before the present devices, systems, and/or methods are disclosed and described, it is to be understood that this disclosure is not limited to the specific devices, systems, and/or methods disclosed unless otherwise specified, as such can, of course, vary. It is also to be understood that the terminology used herein is for the purpose of describing particular aspects only and is not intended to be limiting.

The current invention is directed towards a battery cell connector system 10 that includes a battery connector 100 with a voltage transmitting component 200 to connect to a battery management system (BMS) 30, as shown in FIGS. 6-9. In an aspect, the battery connector 100 is configured to engage/touch/connect a plurality of battery cells 20, and the voltage transmitting component 200 is configured to connect the cladded battery connector to an external device, such as a BMS 30.

In an aspect, the battery connector 100 includes a body 110 made from a clad material. In a portion of these aspects, the clad material comprises at least a three-layer clad material, though more layers could be used if necessary based on application. However, it is preferable that clad material that forms the body 110 includes at least one inner layer 112 and two outer layers 114 (e.g., see FIGS. 8A and 9A). In an aspect, the layers of the body are configured such that the outer layers 114 are highly weldable while an inner 112 layer is highly conductive. In an aspect, current from the batteries 20 in contact with the battery connector body 110 will follow a path of least electrical resistance through the outer, weldable layers 114 into the inner, conductive layer 112. In an aspect, using three layers may reduce production costs associated with more layers (e.g. five-layered clad materials). The clad material is configured to be non-plated. Eliminating plating can reduce production cost. However, such an elimination can produce potential soldering issues, which the voltage transmitting component 200 addresses, as shown below.

In aspects of the battery connector system 10 that include a three-layered cladded material body 110, the outer layers 114 can be steel, stainless steel, or an alloy thereof with an inner layer 112 of copper or copper alloys, with the stainless steel of the outer layers 114 surrounding the copper of the inner layer 112. In such aspects, steel, stainless steel, or alloys thereof are selected for the outer layers 114 due to high weldability. In these aspects, a variety of stainless steel grades (e.g., 304 SS, 316SS, 430 SS, etc.) can be utilized. In other aspects, other weldable metals, including, but not limited to, nickel, aluminum, brass, and alloys thereof, can be utilized for the other layers 114.

In an aspect, copper and copper alloys are selected for the inner layer 112 due to high electrical conductivity. In other aspects, highly conductive metals, including, but not limited to, silver, gold, aluminum, zinc, nickel, brass, bronze, and alloys thereof, can be utilized for the inner layer 112. In other aspects, various other materials can be utilized.

In an exemplary aspect, the three-layer clad material has a 304 SS/Cu/304 SS configuration though other grades of stainless steel could be used. In another aspect, a five-layer clad material can be utilized as well. For example, five layer cladded materials having configurations of Ni/304 SS/Cu/304 SS/Ni or Ni/430 SS/Cu/430 SS/Ni can be utilized.

In an aspect, the IACS of the three-layer cladded material can range between 40% to 80% while the IACS of the five-layer cladded material can range between 26% to 60%. In an aspect, the thermal conductivity of both the three-layer cladded and the five-layer cladded material can range between 178 W/m-K to 317 W/m-K. Electrical conductivity can be converted to an estimate of Thermal Conductivity through the Wiedemann-Franz law.

In an aspect, the tensile strength of the three-layer cladded material can range between 282 MPa to 475 MPa while the tensile strength of the five-layer cladded material can range between 360 MPa to 550 MPa. In an aspect, the yield strength of the three-layer cladded material can range between 93 MPa to 205 MPa while the yield strength of the five-layer cladded material can range between 110 MPa to 265 MPa. In an aspect, the density of the three-layer cladded material and the five-layer cladded material can range between 8,415 kg/m$^3$ to 8,666 kg/m$^3$. In an aspect, the elongation percentage of the three-layer cladded material and the five-layer cladded material can range between 43% to 48%. In an aspect, the Erichsen cup height of the three-layer cladded material and the five-layer cladded material can range between 11.2 mm to 11.9 mm. In an aspect, the elastic modulus of the three-layer cladded material and the five-layer cladded material can range between 131 GPa to 165 GPa. In an aspect, the constant of thermal expansion of the three-layer cladded material and the five-layer cladded material can range between 16.6 µm/m° C. to 17.1 µm/m° C.

In an aspect, the specific heat of the three-layer cladded material and the five-layer cladded material can range between 413 J/kg-° C. to 447 J/kg-° C. In an aspect, the resistivity of the three-layer cladded material and the five-layer cladded material can range between $2.155 \times 10^{-8}$ ohm-m to $4.310 \times 10^{-8}$ ohm-m. The cladded material can include additional properties, minus those ones attributable to the platting layer (e.g., nickel), similar to those of the cladded materials disclosed in U.S. patent application Ser. No. 14/730,921 (now granted U.S. Pat. No. 10,707,472), which is hereby incorporated by reference in its entirety. Additional exemplary properties (e.g. density, elastic modulus, etc.) of exemplary cladded materials used in the invention are displayed in Table 1 below.

TABLE 1

| Composition | Austenitic Stainless Steel/Copper/Austenitic Stainless Steel | | | | |
|---|---|---|---|---|---|
| Ratio | 40% Copper | 60% Copper | 80% Copper | | |
| Physical Properties @ 20° C. (typical properties) | Li-ionClad ™ 40 Annealed | Li-ionClad ™ 60 Annealed | Li-ionClad ™ 80 Annealed | 201 Nickel (Annealed) | Ni Plated Steel (AISI 1020) |
| Density (kg/m$^3$) | 8,415 | 8,580 | 8,666 | 8,900 | 7,870 |
| Yield Strength (MPa) | 205 | 138 | 93 | 103 | 350 |
| Tensile Strength (MPa) | 475 | 368 | 282 | 414 | 420 |
| Elongation % | 45 | 48 | 43 | 45 | 15 |
| Erichsen Cup Height (mm) | 11.2 | 11.9 | N/A | 12.1 | N/A |
| Elastic Modulus (GPa) | 165 | 148 | 131 | 207 | 186 |
| CTE: (μm/m° C.) | 16.6 | 16.7 | 17.1 | 13.3 | 11.7 |
| Thermal Conductivity[2] (W/m-K) | 178 | 253 | 317 | 79 | 52 |
| Specific Heat (J/Kg-° C.) | 447 | 423 | 413 | 456 | 486 |
| Conductivity (% IACS)[1] | 40% | 60% | 80% | 20% | 11% |
| Resistivity (ohm-m) | 4.310E−08 | 2.874E−08 | 2.155E−08 | 8.621E−08 | 1.567E−07 |

[1]Properties can vary depending on finish thickness
[2]Parallel to strip direction
[3]Li-ionClad ™80 mechanical properties based on limited data The cladded material that forms the body 110 of the battery connector 100 can be bonded together via various methods, including rolling, cold-bond rolling, and other known bonding methods. By utilizing a cladded material for the battery connector 100, a combination of properties of two different materials can be utilized. By utilizing copper or a copper alloy thereof and steel, stainless steel or an alloy thereof, the battery connector 100 has a combination of higher electrical and thermal conductivity due to the inner layer 112 of copper or a copper alloy thereof and a high weldability from the outer layer 114, the layer that will be welded, of steel, stainless steel, or an alloy thereof. In an aspect, the outer steel layer 114 is highly weldable due to its ability to be used in a variety of welding applications with low surface preparation. In a preferred aspect, the outer steel layer 114 can be welded via resistance welding. In other aspects, the outer steel layer can be welded via TIG welding, Micro TIG welding, laser welding, ultrasonic welding, and other known welding techniques.

The cladded material can be formed into the body 110 of the battery connector 100 in numerous ways. In an aspect, the body 110 of the battery connector 100 is stamped out of flat stock of the cladded material (see FIG. 7). However, other methods known in the art can be used to make the connector 100. In an aspect, the battery connector 100 can be made into numerous forms that are dependent on the number and needed configuration of the battery cells 20.

In general, the battery connector 100 will have a number of arms 120 (e.g., FIGS. 6 and 8-9), some of which may include battery engagement tabs 122, depending on the form of welding used to contact the body 110 to the battery cells 20, extending from a central member 124. For example, the cladded battery connector 100 is configured to have five arms 120, four of which are configured to engage four LI-ion battery cells 20 in parallel. The fifth arm 120 can be configured to be a terminal arm 126. However, in other aspects, various other types of battery cells 20, in series, parallel, or both, as well as other numbers of cells 20, can be utilized. Likewise, the lengths, widths, and orientation (flat, angled, shortened, etc.) of the arms 120 can vary dependent on the ultimate layout of the battery cells 20, and their relation to the BMS 30.

In an aspect, a terminal 150 can be connected to the outer surface/outer layer 114 of the battery connector 100, as shown in FIGS. 8, 8B, 9, and -9B. In some aspects, the terminal 150 can be connected to the terminal arm 126 of the connector 100. The terminal 150 can be selected from a material such that it is easily welded to the outer layer 114 of the battery connector body 110. Easily welded materials can be selected from stainless steel, steel, nickel, aluminum, brass, alloys thereof, and other easily welded materials known in the art. In an aspect, the terminal 150 can be a crimped terminal 150 welded to the battery connector 110 (e.g. at the terminal arm 126) on one side 152 while receiving the voltage transmitting component 200 via crimping on the other side 154. In other aspects, other known varieties of terminals 150 could be used to connect the voltage transmitting component 200 and battery connector 100, such as welding a male terminal feature on the battery cell connector body 110, crimping a female terminal onto the voltage transmitting component 200, and inserting the two terminals into each other.

Figure 5:
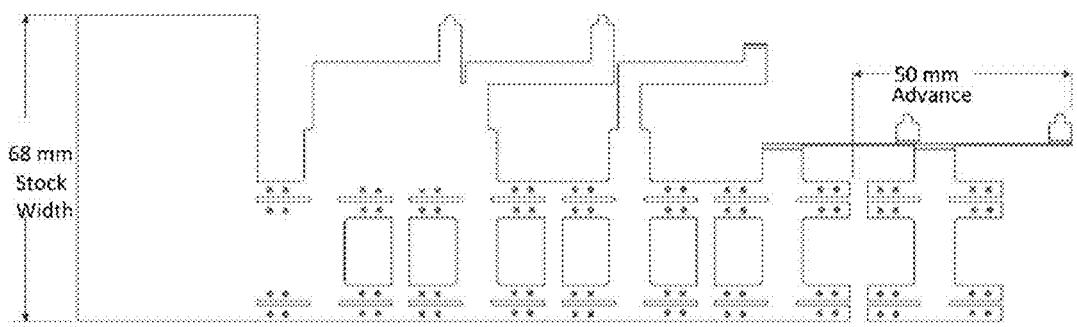
FIG. 5 illustrates the stamping schematics for the high scrap yield design illustrated in FIG. 4 as well as the required dimensions (e.g. stock width and advance).
Figure 6:
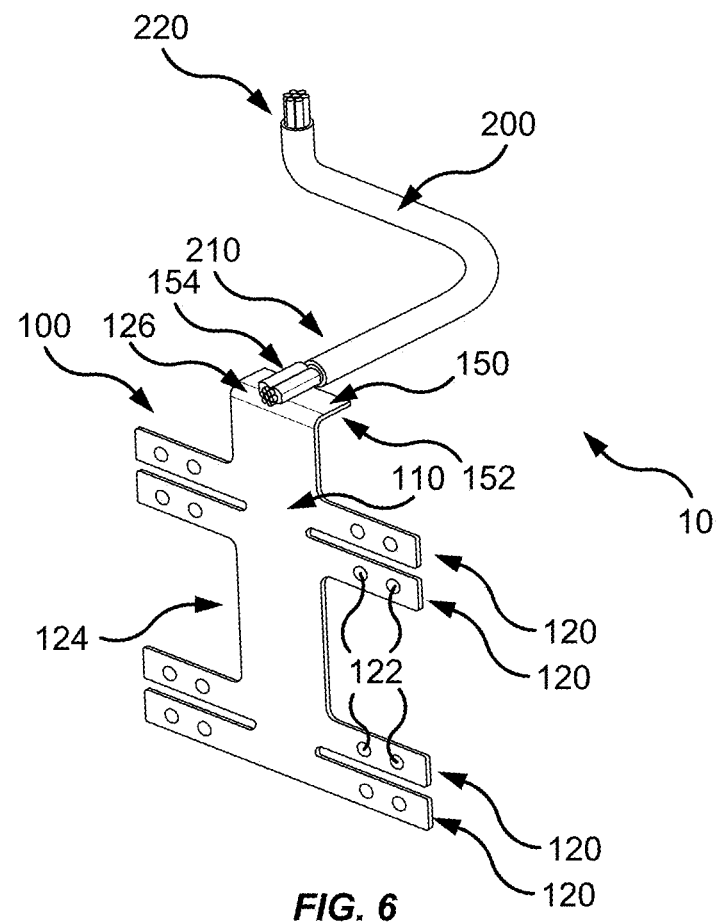
FIG. 6 illustrates a battery connector system according to an aspect of the current invention.
Figure 7:
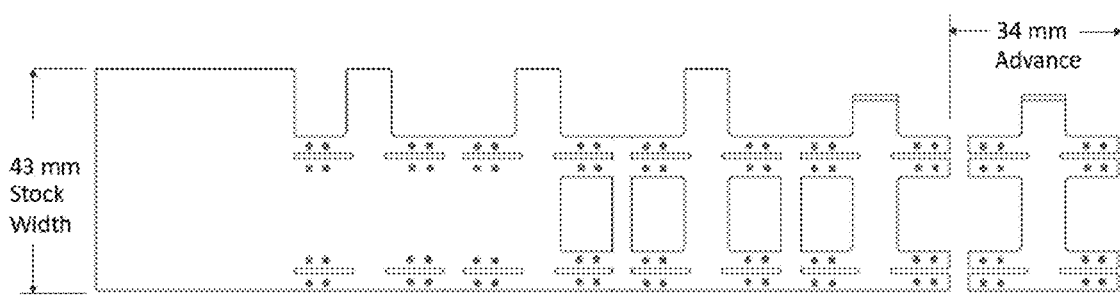
FIG. 7 illustrates the stamping schematics for the current invention illustrated in FIG. 6 as well as the required dimensions (e.g. stock width and advance).

As discussed previously, battery connectors used today traditionally include an integrated BMS connector with the connector body, as shown in FIG. 1. The battery connector system 10 of the current invention does not have an integrated BMS connector attached to the top of the body of the battery connector 100; instead, the battery connector system 100 utilizes a voltage transmitting component 200 to replace the integrated BMS connector as displayed in FIG. 6. Using the voltage transmitting component 200 eliminates the need of an integrated BMS connector, made from the same clad material or a mono metal in the case of the prior art. Thus, the manufacture of the battery connector system 10, and more specifically the battery connector 100, is easier with lower material requirements and costs. Lower material requirements facilitate a lighter device in the case of the current invention when compared to the prior art. A comparison of prior art material requirements and costs to those of the current invention is shown in Table 2 below. Further, by utilizing a voltage transmitting component 200, a smaller scrap yield is designed, as shown in FIGS. 5 and 7. That is, less material has to be cut from the cladded material to make the battery connector body 110 and arms 120, 126. While it is okay to design connectors of mono metals with large scrap yields due to the high scrap reclaim, the same cannot be said of clad metal connectors. Scrap cannot be as easily reclaimed with clad materials as there are multiple materials that are in the scrap.

TABLE 2

| Design Style | Part Weight (Kg/lbs) | Material Cost ($ per Kg/$ per lb) | Integrated 22 AWG 40 mm Wire Cost ($) | Total Battery Connector System Cost ($) |
| --- | --- | --- | --- | --- |
| Prior Art with Integrated BMS Connector (No Wire) | 0.0068/ 0.015 | 16/7.27 | 0 | 0.109 |
| Li-ion Clad Connector with Integrated Wire-Lead (Current Invention) | 0.0023/ 0.0049 | 21/9.55 | 0.0409 | 0.087 |

In an aspect, a voltage transmitting component 200 can be used to connect the battery connector 100 to the BMS 30. As the main purpose of the voltage transmitting component 200 is to pass along enough current for voltage readings (which tends to be low current compared to that transmitted through the body 110) for the BMS 30 to monitor the status of the battery cells 20, via the battery connector 100, the voltage transmitting component 200 will typically have a high conductivity value. The length, gage, and other characteristics (e.g. stranded or solid) of the voltage transmitting component 200 can be selected from a variety of combinations depending on application requirements.

In an aspect, the voltage transmitting component 200 has a battery connector end 210 and a BMS connecting end 220. In an aspect, the voltage transmitting component 200 can be a wire 200. In such aspects, the wire 200 includes a tinned copper wire. In other aspects, the voltage transmitting component 200 can be any suitable conductive material such as copper, silver, gold, aluminum, zinc, nickel, brass, bronze, alloys thereof, and other materials known in the art. In extreme environments, the voltage transmitting component 200 can be coated with Teflon. In aspects, when the conductive material used for the voltage transmitting component 200 is not solderable (e.g., copper), the voltage transmitting component 200 at least at the BMS connecting end 220 is treated so that it can be soldered to the BMS 30 as shown in FIGS. 8-9. In such aspects, the BMS connecting end 30 can be tinned. In aspects of the voltage transmitting component 200 being solderable (e.g., nickel), tinning is not necessary.

In an aspect, the voltage transmitting component 200 at the battery connector end 210 may be crimped (e.g., putting a terminal on the end) to allow resistance welding to the battery connector 100, as shown in FIGS. 9 and 9B. The BMS connector end 220 of the voltage transmitting component 200 is configured to be soldered directly to a BMS 30 (FIGS. 8C and 9C). The length and the cross-section of the voltage transmitting component 200 can vary based upon the function, size, and location, relative to the battery connector 100, of the BMS 30. For example, if the voltage transmitting component 200 to the battery connector 100 is strictly for measuring cell voltage, the cross-section can be small. In other aspects, when the voltage transmitting component 200 is used for connecting directly to the load, a voltage transmitting component 200 with a larger cross-section can be used. In an exemplary aspect, the voltage transmitting component 200 may be 22 AWG 7/30 stranded tinned copper wire with a length of 40 mm, though other voltage transmitting components may be used. In such an aspect, PVC wire insulation may be used. In additional aspects, AWG sizes of the voltage transmitting component may range from AWG 18 to AWG 26, but other sizes can also be employed. In additional aspects, stranding configurations of the voltage transmitting component may include, but are not limited to, 19/23, 19/29, and other available stranding configurations. In additional aspects, lengths of the voltage transmitting component may range from 15 mm to 600 mm, but other lengths can also be employed. In additional aspects, the voltage transmitting component may comprise solid wire configurations. The variety of configurations for the voltage transmitting component, 200, described above afford a customizability in using the battery cell connector system, 10, with a variety of configurations of pluralities of battery cells, 20. The combined effect of the voltage transmitting component, 200, with a previously described terminal, 150, allows the decoupling of the battery connector body, 110, from the voltage transmitting component, 200, for total design customizability.

In an aspect, the voltage transmitting component 200 is connected to a BMS 30 as to measure voltage outputs from a plurality of battery cells 20. Measuring voltage outputs of batteries 20 in series or parallel allows maintenance of battery safety and reliability. In an aspect, a charge voltage of 4.8V and a discharge voltage of 2.5V, managed by the BMS 30 are desired. In other aspects, the voltage transmitting component 200 is connected to an external device selected from a BMS 30, a voltmeter, and other devices known in the art that monitor properties of battery cells 20. In an aspect, the voltage transmitting component 200 can assist in providing measured properties of the battery cells 20 that include capability estimation, state of charge, state of health, thermal management, load, current, and other properties known in the art to be important in the functioning of batteries and other electrical devices.

Although several aspects have been disclosed in the foregoing specification, it is understood by those skilled in the art that many modifications and other aspects will come to mind to which this disclosure pertains, having the benefit of the teaching presented in the foregoing description and associated drawings. It is thus understood that the disclosure is not limited to the specific aspects disclosed hereinabove, and that many modifications and other aspects are intended to be included within the scope of any claims that can recite the disclosed subject matter.

It should be emphasized that the above-described aspects are merely possible examples of implementations, merely set forth for a clear understanding of the principles of the present disclosure. Any process descriptions or blocks in flow diagrams should be understood as representing modules, segments, or portions of code which comprise one or more executable instructions for implementing specific logical functions or steps in the process, and alternate implementations are included in which functions may not be included or executed at all, can be executed out of order from that shown or discussed, including substantially concurrently or in reverse order, depending on the functionality involved, as would be understood by those reasonably skilled in the art of the present disclosure. Many variations and modifications can be made to the above-described aspect(s) without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

That which is claimed is:

1. A battery cell connector for use with a battery management system (BMS), the battery cell connector comprising:
 a. a non-plated battery connector body configured to connect a plurality of batteries, wherein the body consists of three layers comprised of two outer layers and one inner layer, wherein the body is:
  i. highly electrically conductive having a range of 26% IACS to 80% IACS;
  ii. highly weldable having a range of 178 W/mK to 317 W/mK; and
  iii. wherein the body comprises stainless steel and copper;
 b. a terminal in communication with the battery connector via a welded connection; and
 c. a wire voltage transmitting component having a terminal end and a BMS end, wherein the terminal end is crimped to be connected to the terminal and wherein the BMS end is tinned in order to be soldered to the BMS.

2. The battery cell connector of claim 1, wherein the outer layers of the body are selected from metals that are highly weldable having a range between 178 to 317 W/mK.

3. The battery cell connector of claim 1, wherein an inner layer is comprised of a conductive metal.

4. The battery cell connector of claim 1, wherein the body is connected to a plurality of batteries by welding the body directly to battery terminals of the plurality of battery terminals.

5. The battery cell connector of claim 1, wherein the wire of the voltage transmitting component is copper tinned.

6. The battery cell connector of claim 1, wherein the voltage transmitting component is configured to pass along to the BMS a property of the plurality of batteries.

7. The battery cell connector of claim 6, wherein the property being measured is selected from capability estimation, state of charge, state of health, thermal management, or voltage.

8. The battery cell connector of claim 7, wherein the voltage measured is charge and discharge voltages.

9. The battery cell connector of claim 1, wherein the layers of the body further comprises nickel.

10. The battery cell connector of claim 1, wherein the body has a tensile strength ranging between approximately 282 MPa to 550 MPa.

11. The battery cell connector of claim 1, wherein the non-plated battery connector is absent nickel.

* * * * *